United States Patent
Ohmi et al.

[11] Patent Number: 6,153,068
[45] Date of Patent: Nov. 28, 2000

[54] PARALLEL PLATE SPUTTERING DEVICE WITH RF POWERED AUXILIARY ELECTRODES AND APPLIED EXTERNAL MAGNETIC FIELD

[75] Inventors: Tadahiro Ohmi, 1-17-301. Komegabukuro 2-chome. Aoba-ku. Sendai-shi, Miyagi-ken 980-0813; Masaki Hirayama, Miyagi-ken; Haruyuki Takano, Miyagi-ken; Yusuke Hirayama, Miyagi-ken, all of Japan

[73] Assignee: Tadahiro Ohmi, Miyagi-ken, Japan

[21] Appl. No.: 09/035,325

[22] Filed: Mar. 5, 1998

[30] Foreign Application Priority Data

Mar. 7, 1997 [JP] Japan .................................. 9-070431

[51] Int. Cl.⁷ .................................................. C23C 14/34
[52] U.S. Cl. ............................... 204/298.06; 204/298.08; 204/298.14
[58] Field of Search ......................... 204/192.12, 298.01, 204/298.02, 298.06, 298.07, 298.08, 298.16, 298.17, 298.19, 298.14

[56] References Cited

U.S. PATENT DOCUMENTS

| | | | |
|---|---|---|---|
| 5,178,739 | 1/1993 | Barnes et al. | 204/192.12 |
| 5,316,645 | 5/1994 | Yamagami et al. | 204/298.06 |
| 5,431,799 | 7/1995 | Mosely et al. | 204/298.06 |
| 5,800,688 | 9/1998 | Lantsman et al. | 204/298.11 |

FOREIGN PATENT DOCUMENTS

| | | | |
|---|---|---|---|
| WO 89/06437 | 7/1989 | Japan | H01L 21/31 |
| 6-252059 | 9/1994 | Japan | H01L 21/205 |
| 08319564 | 12/1996 | Japan | C23C 14/34 |
| WO 98/01898 | 1/1998 | Japan | H01L 21/3065 |

Primary Examiner—Nam Nguyen
Assistant Examiner—Gregg Cantelmo
Attorney, Agent, or Firm—Randall J. Knuth

[57] ABSTRACT

The present invention provides a sputtering device provided with two electrodes I and II of parallel plate type within a vessel inside which pressure can be reduced, wherein: a target to be sputtered is placed on said electrode I, and a base body on which a film is to be deposited is placed on said electrode II, with the target and the base body being opposed to each other; a process gas is introduced into said vessel from a gas supply system; radio frequency power is applied to said target through at least said electrode I so as to excite plasma between the electrode I and the electrode II; characterized in that: outside said vessel, is provided a means for introducing magnetic field horizontal at least to a surface to be sputtered of said target.

2 Claims, 9 Drawing Sheets

PARALLEL PLATE SPUTTERING DEVICE WITH RF POWERED AUXILIARY ELECTRODES AND APPLIED EXTERNAL MAGNETIC FIELD

BACKGROUND OF THE INVENTION AND DESCRIPTION OF RELATED ART

1. Technical Field

The present invention relates to a sputtering device, and in particular to a sputtering device provided with a means for introducing magnetic field which is horizontal to a target surface to be processed by sputtering, so as to enable to perform uniform sputtering all over the surface of the target.

2. Background Art

Recently, as chip sizes of DRAM, MPU etc. become larger, silicon substrates used as their base bodies tend to have larger diameters. For the case that a thin film is to be formed on a larger-diameter base body by sputtering, it is desired to develop a sputtering device which can use a target having a larger diameter corresponding to a size of a base body, and can form a homogeneous deposit film having uniform film thickness on the base body.

As a conventional sputtering device, is mentioned an RF sputtering device FIG. 6) which has parallel plate electrodes and sputters a target while applying RF bias to the target, or a magnetron sputtering device (FIG. 7) which has such structure that magnetic field is generated from a back surface of a target, and which applies RF bias to the target while applying that magnetic field, so as to generate higher-density plasma on the surface of the target.

FIG. 9 shows a result of investigating sputtering capacity of the above-described RF sputtering device and magnetron sputtering device. Namely, after application of radio frequency power (13.56 MHz) to an Al target (150 mmφ) for 100 hours, scraped amounts of the target were investigated at 8 points on a surface of the target at intervals of 20 mm in the diametral direction to obtain the result. From this result, it is seen that a magnetron sputtering device has higher sputtering capacity than a RF sputtering device. As shown in FIG. 8, however, in the magnetron sputtering device, directions of the magnetic field generated on the target surface are not uniform, and accordingly, on the target surface, strong plasma is generated only in a limited space enclosed by magnetic flux.

One method of avoiding this problem that is known in the art utilizes a yoke structure design rotating a magnet mechanism on a back surface of a target, and the like. However, in the case that yoke structure design is employed, it leads to complication of the hardware, and in the case that the magnet mechanism is rotated, plasma is rotated and accordingly film substance grown on a substrate becomes weak in stress resistance. In addition, deposit film with uniform quality can not necessarily be obtained on a base body.

OBJECT AND SUMMARY OF THE INVENTION

An object of the present invention is to provide [provided] a sputtering device which provides a [can make] plasma with a uniform density [uniform for a target] and deposits a film with a [can form deposit film having] uniform film quality on a base body.

The present invention provides a sputtering device provided with two electrodes I and II of parallel plate type within a vessel inside which pressure can be reduced, wherein: a target to be sputtered is placed on said electrode I, and a base body on which a film is to be deposited is placed on said electrode II, with the target and the base body being opposed to each other; a process gas is introduced into said vessel from a gas supply system; radio frequency power is applied to said target through at least said electrode I so as to excite plasma between the electrode I and the electrode II; characterized in that: outside said vessel, is provided a means for introducing magnetic field horizontal at least to a surface to be sputtered of said target.

(Symbols)
100 vessel, 101 means for introducing magnetic field, 102 electrode I,
103 target, 104 auxiliary electrode A, 105 base body,
106 electrode II, 107 auxiliary electrode B,
108–110 band eliminators (B.E.), 111 and 112 low-pass filters,
113–115 AC power supplies, 116–118 matching circuits,
119 and 120 DC power supply, 121 gas supply system,
122 turbo-molecular pump, 123 dry pump, and 124 exhaust system,
200 vessel, 230a, 230b permanent magnets, 300 vessel, 303 target, 330 permanent magnet, 601 sputtering chamber, 602 anode, 603 target, 604 shutter, 605 shield, 606 gas supply port, 607 exhaust port, 608 matching circuit, 609 RF power supply, 610 matching box, 703 target, 704 erosion position, 705 shield, 706 magnet, 707 magnet support, 708 power supply line, 709 cooling water inlet, 710 cooling water exit, 711 insulating material, 803 target, 806 magnet, 807 magnet support, 812 leakage flux

DETAILED DESCRIPTION OF THE PREFERRED EMBODIMENT OF THE INVENTION (Best Mode for Carrying Out the Invention)

Figure 1:
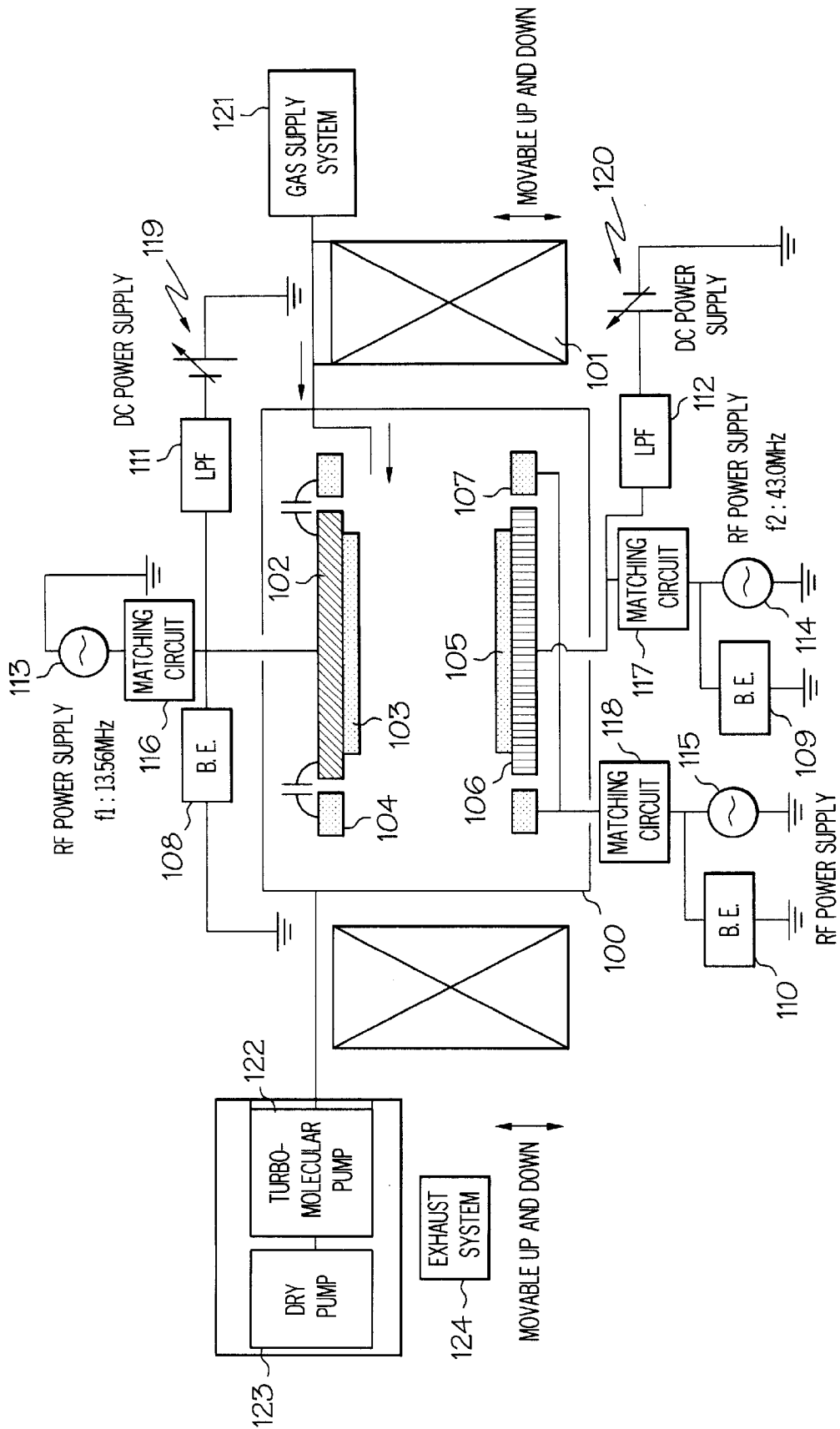
FIG. 1 is a schematic sectional view showing an embodiment of the sputtering device according to the present invention.

FIG. 1 is a schematic sectional view showing an example of the sputtering device according to the present invention.

In FIG. 1, reference numeral 100 refers to a vessel, inside which pressure can be reduced, 101 to a means for introducing magnetic field, 102 to an electrode I, 103 to a target, 104 to an auxiliary electrode A, 105 to a base body, 106 to an electrode II, 107 to an auxiliary electrode B, 108–110 to band eliminators (B.E.), 111 and 112 to low-pass filters, 113–115 to AC power supplies, 116–118 to matching circuits, 119 and 120 to DC power supply, 121 to a gas supply system, 122 to a turbo-molecular pump, 123 to a dry pump, and 124 to an exhaust system.

In FIG. 1, the vessel 100 can be reduced in pressure to such a level that plasma process can be carried out in its inside. To that end, the gas supply system 121 introduces gas into the vessel 100 for plasma excitation, and the exhaust system 124 can reduce the pressure inside the vessel.

As wall surface material of the vessel 100, Al alloy or the like may be used. Preferably, however, nitrided material (for example, AlN) may be used, taking it into consideration that water content released from the chamber wall surface etc. deteriorates adherence between material to be formed with film and the base body to be processed, and that other material than the target base body to be processed is sputtered. This is not limited to the chamber wall surface, and, as the electrodes and other materials within the chamber, materials which do not release water content and have higher plasma resistance should be used as far as possible. Candidates of conductive material are glassy carbon, SiC, etc. and candidates of insulating material are AlN, SiN, etc. Selection of material is decided taking into consideration thermal conductivity, ratio of electric field strength on a surface, and the like.

The means for introducing magnetic field 101 is installed outside the vessel 100, can be moved in upward and downward directions and in rotational direction, and produces uniform magnetic field on the target 103 by introducing magnetic field horizontal to a surface to be sputtered of the target 103.

The electrode I 102 has a function of holding the target 103, while it is an electrode for exciting plasma. This electrode I 102 is electrically connected with the AC power supply 113 through the matching circuit 116, and with the DC power supply through the low-pass filter (LPF). This is provided for controlling energy of ions radiated onto the target 103. When the target is not conductive material, this energy is controlled by varying frequency and power of the radio frequency power supply.

The target 103 is a parent material to form a deposit film on a base body 105 placed in an opposite position. As the target 103, semiconductor material such as Si, metal material such as W, Ta, and insulating material such as $SiO_2$ can be used preferably, for example. Further, the material used as the target 103 is not limited to one to be directly formed as a film. Material which is different in chemical composition or which is to constitute a part of composition of the material of the aimed film may be used and reacted with gas existing within the plasma, so at to form the desired deposit film. By carrying out such a method of forming deposit film, i.e., a reactive sputtering method, it is possible, for example, to form SiN film by using Si as the target 103 and $N_2$ as the gas for producing plasma.

The auxiliary electrode A 104 is provided in the area outside the outer peripheral end of the target, and is contacted with the electrode I 102. The connection between the electrode I 102 and the auxiliary electrode A 104 may be of an electrical conductive state, or, alternatively, may be connected through a condenser to have electrical capacity. In particular, in the latter case, the auxiliary electrode A 104 is not easily sputtered. The auxiliary electrode A 104 has an effect of enlarging generation space for the plasma excited on the target 103 toward the inside of the surface, and is greatly different in function from a yoke of magnetic material employed in the conventional technique as a means for introducing magnetic field.

The base body 105 is a substrate for receiving particles etc. sputtered from the target 103 and for depositing a film on it. As the base body 105, for example, Si substrate, SiC substrate, glass substrate, or the like may be used, although it is not limited to these.

The electrode II 106 has a function of holding the base body 105, and is connected with the AC power supply 114 through the matching circuit 117 as well as connected with the DC power supply 120 through the low-pass filter (LPF) 112. This is to give self-bias to the base body 105. In the case that the base body 105 is conductive and the material to be formed as the film on the base body 105 is also conductive, only the DC power supply 120 may suffice. In the case that either of them is insulating material, the DC power supply 120 is not necessary and it is suffice that only the AC power supply 114 is connected.

The auxiliary electrode B 107 is located in the area outside the outer peripheral end of the base body 105, and in the position spaced from the base body 105 and the electrode II 106. Further, the auxiliary electrode B 107 is connected with the AC power supply 115 through the matching circuit 118 to apply radio frequency power. This is provided for relaxing bias of the plasma due to application of the magnetic field.

The band eliminators (B.E.) 108–110 are band-rejection filters, and suitably set in such a manner that only radio frequency power having desirable frequencies are applied to the respective electrodes connected, so that the applied radio frequencies are not affect one another.

Embodiments

In the following, the sputtering device according to the present invention will be described referring to the drawings, although the present invention is not limited to these embodiments.

(Embodiment 1)

In this embodiment, the sputtering device shown in FIG. 1 was used with various means for introducing magnetic field 101 to investigate sputtering capacities. Sputtering capacity was evaluated by scraped amounts of an Al target (150 mmφ) at eight points on the surface of the target at intervals of 20 mm in the diametral direction, after applying radio frequency power (13.56 MHz) for 100 hours.

Figure 2:
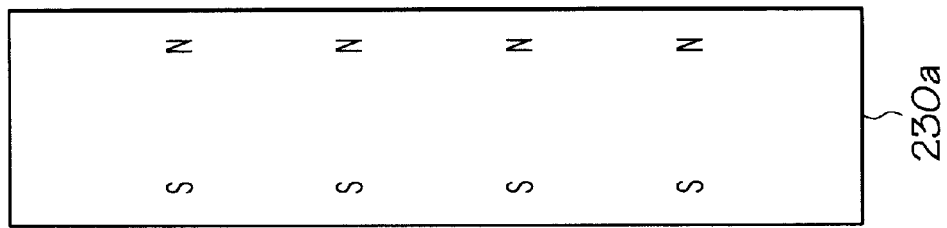
FIG. 2 is a schematic plan view showing a case that a pair of permanent magnets are used as a means for introducing magnetic field shown in FIG. 1.
Figure 2:
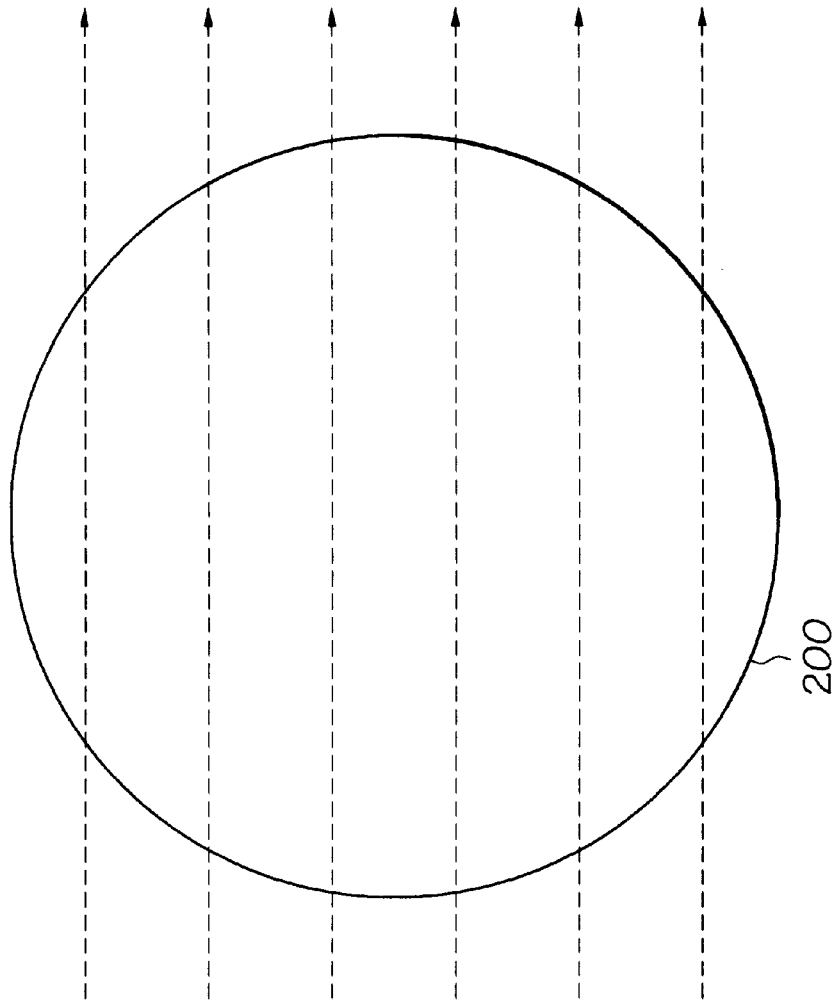
Figure 2:
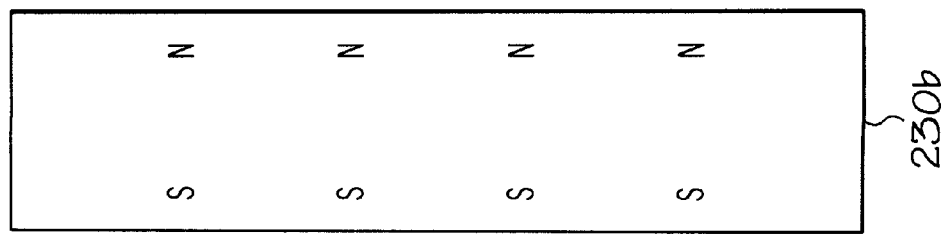
Figure 3:
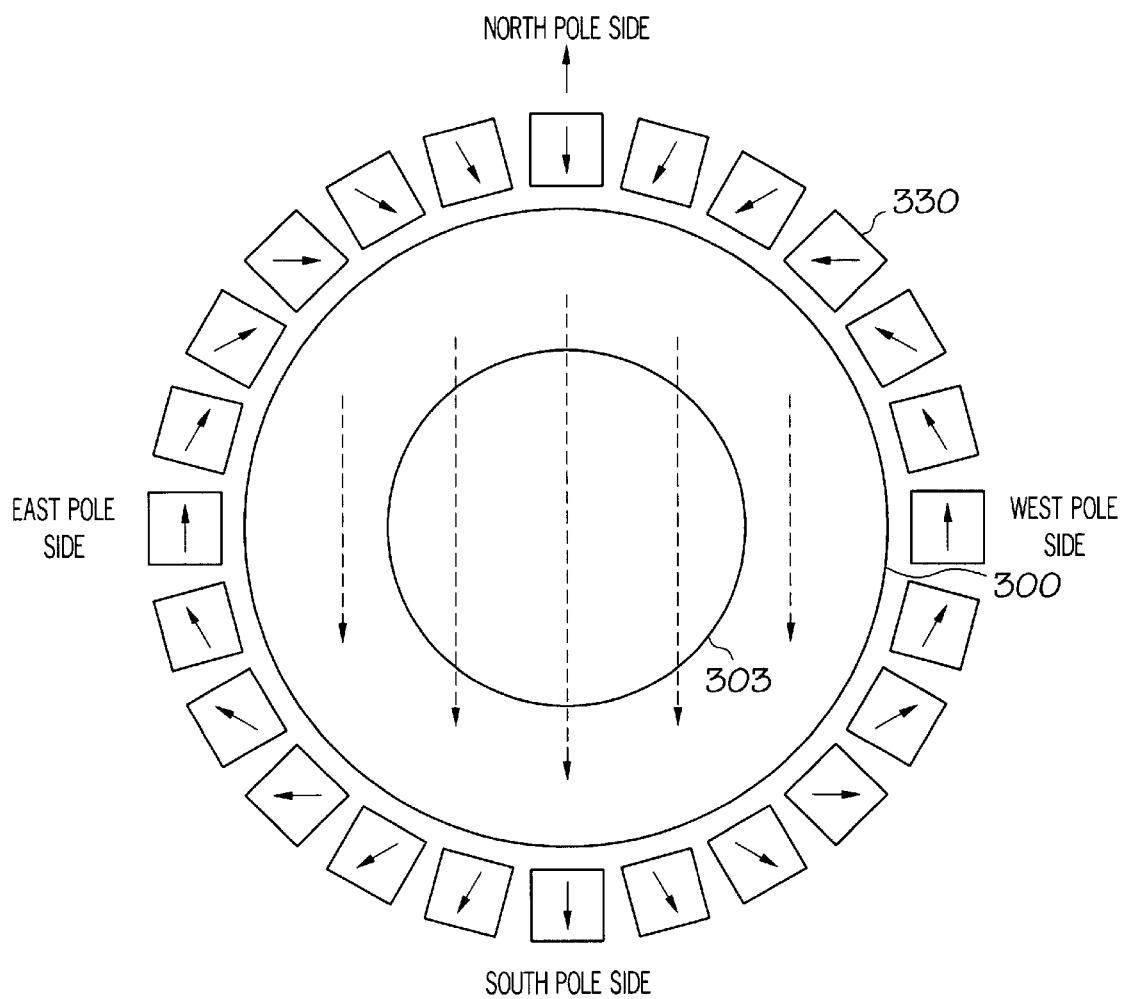
FIG. 3 is a schematic plan view showing a case that a dipole ring magnets (DRM) is used as the means for introducing magnetic field shown in FIG. 1.

As the means for introducing magnetic field 101, a case of magnetic arrangement shown in FIG. 2 and a case of magnetic arrangement shown in FIG. 3 were investigated. In the magnetic arrangement of FIG. 2, a pair of permanent magnets 230*a*, 230*b* are positioned in parallel so that the vessel 200 of the sputtering device is located between them. In the magnetic arrangement of FIG. 3, a plurality of permanent magnets 330 are positioned so as to surround the vessel 300 of the sputtering device, which is a case using "so-called" dipole ring magnets (DRM). In FIG. 3, direction of arrow sign depicted in each permanent magnet shows direction of magnetization.

In the present embodiment, however, the auxiliary electrodes A 104 and B 107 shown in FIG. 1 were not installed.

Figure 4:
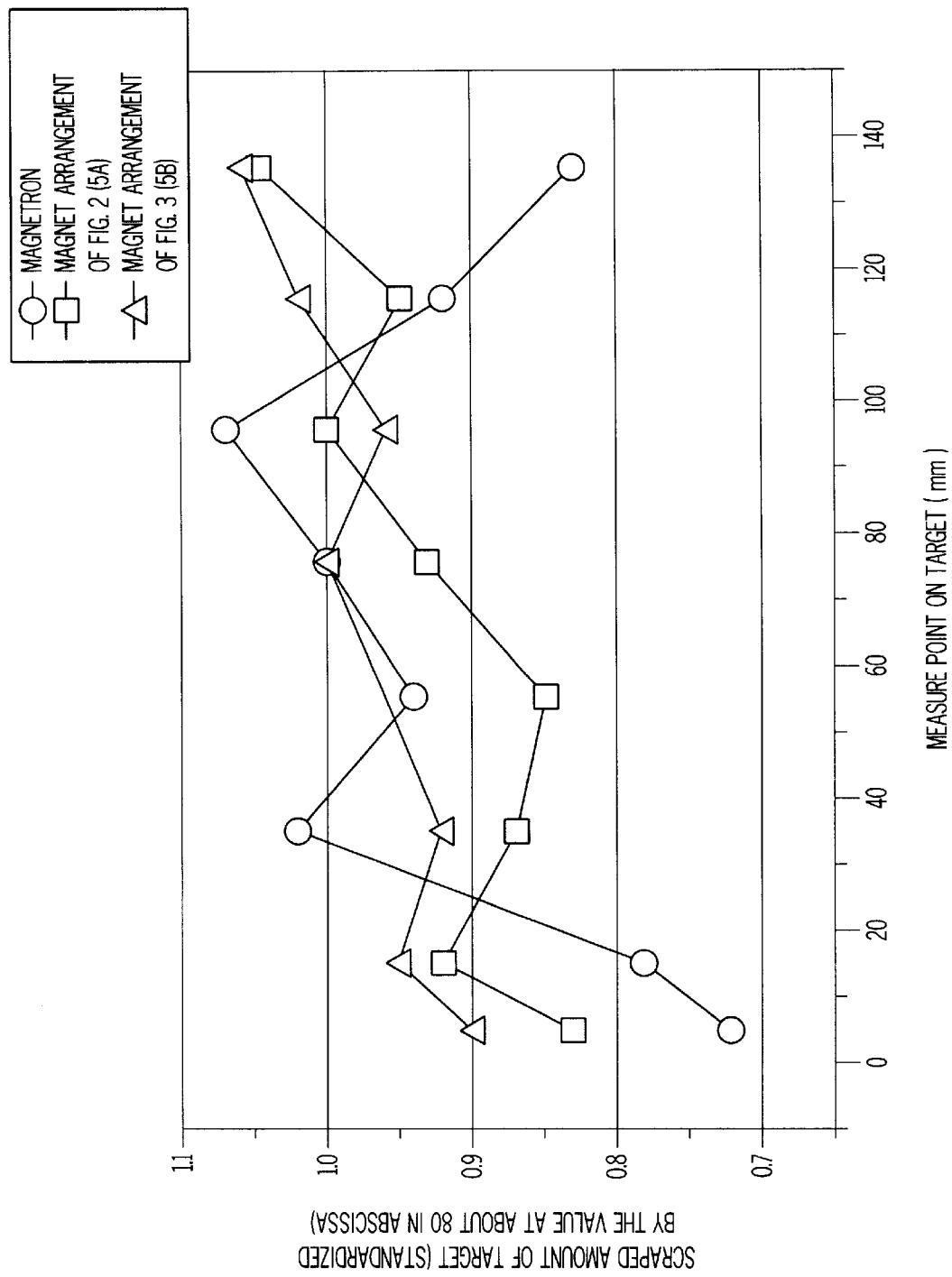
FIG. 4 is a graph showing a result of investigation of scraped amounts of the target in the sputtering device of the present invention.
Figure 6:
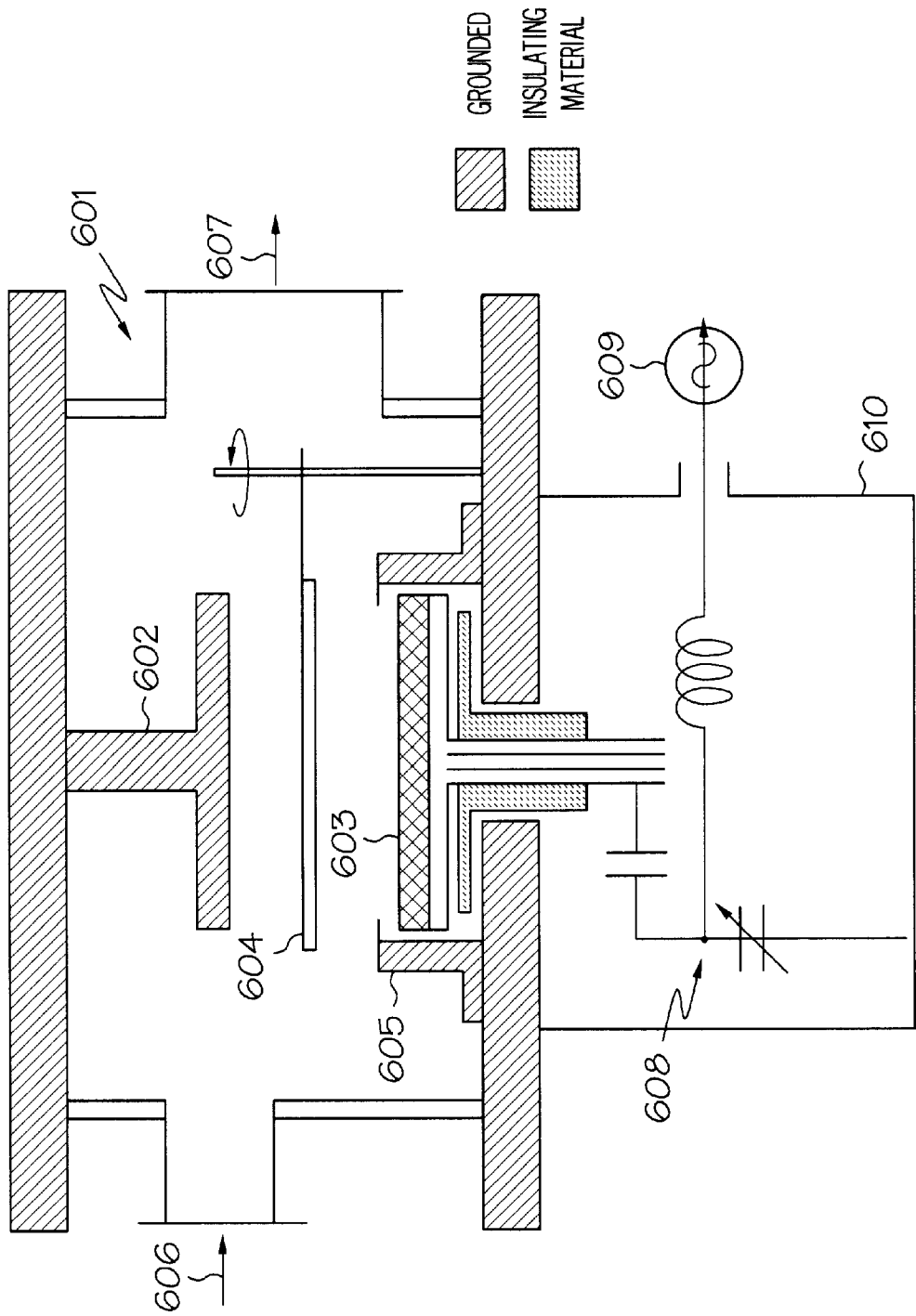
FIG. 6 is a schematic sectional view showing an example of the conventional RF sputtering device.
Figure 7:
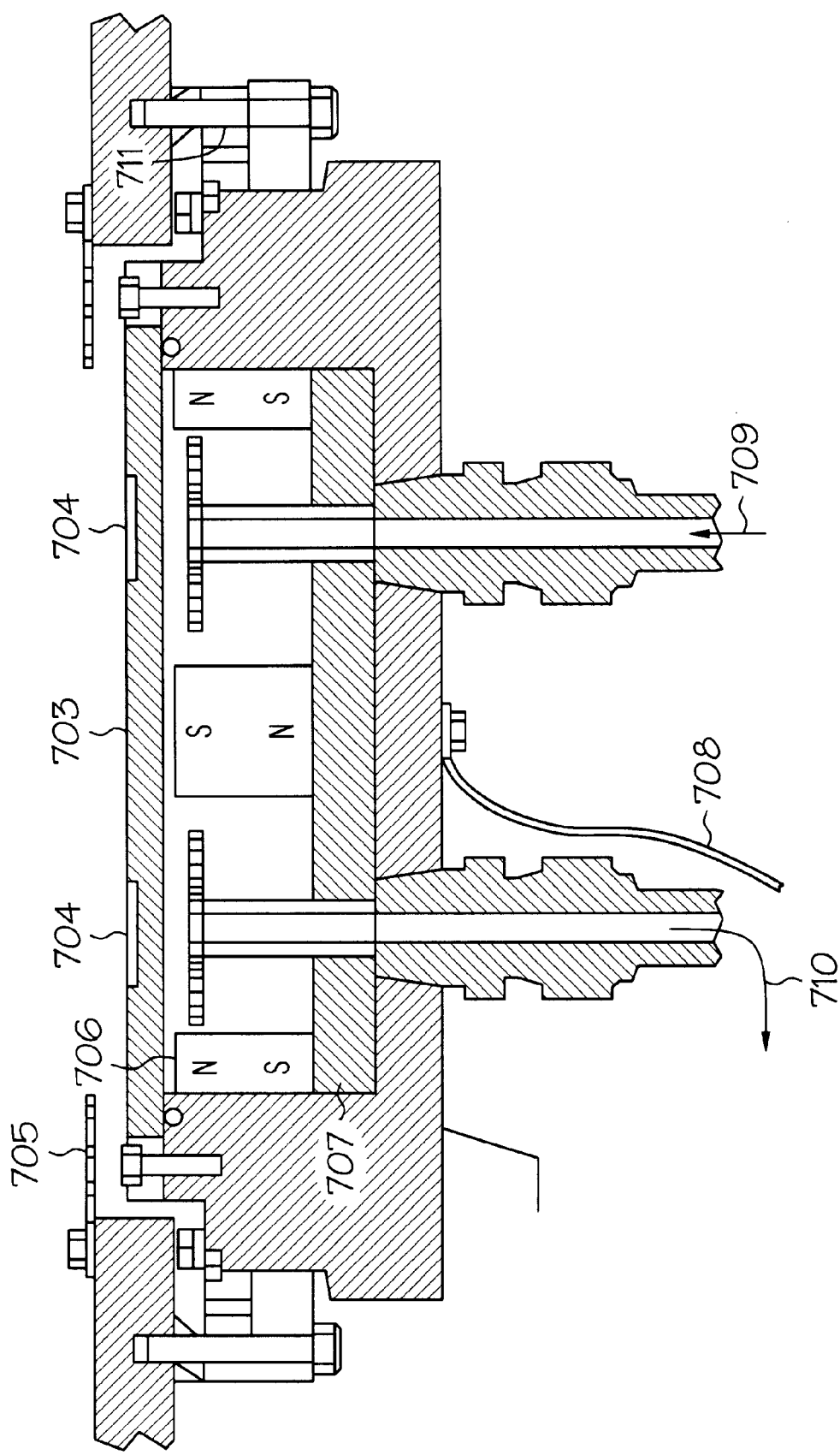
FIG. 7 is a schematic sectional view showing an example of the conventional magnetron sputtering device.
Figure 8:
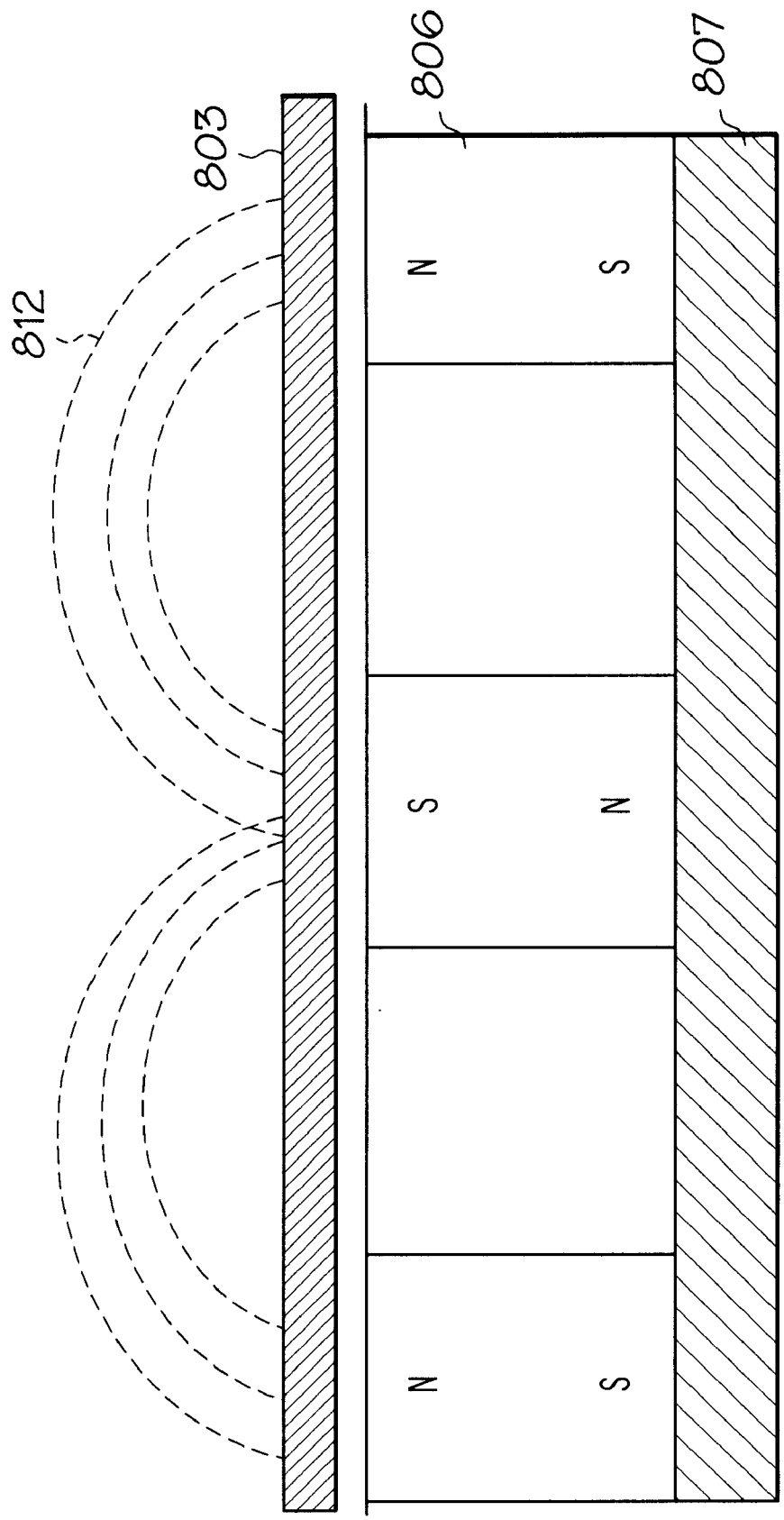
FIG. 8 is a schematic sectional view showing a state of magnetic field generation in the magnetron sputtering device of FIG. 7.
Figure 9:
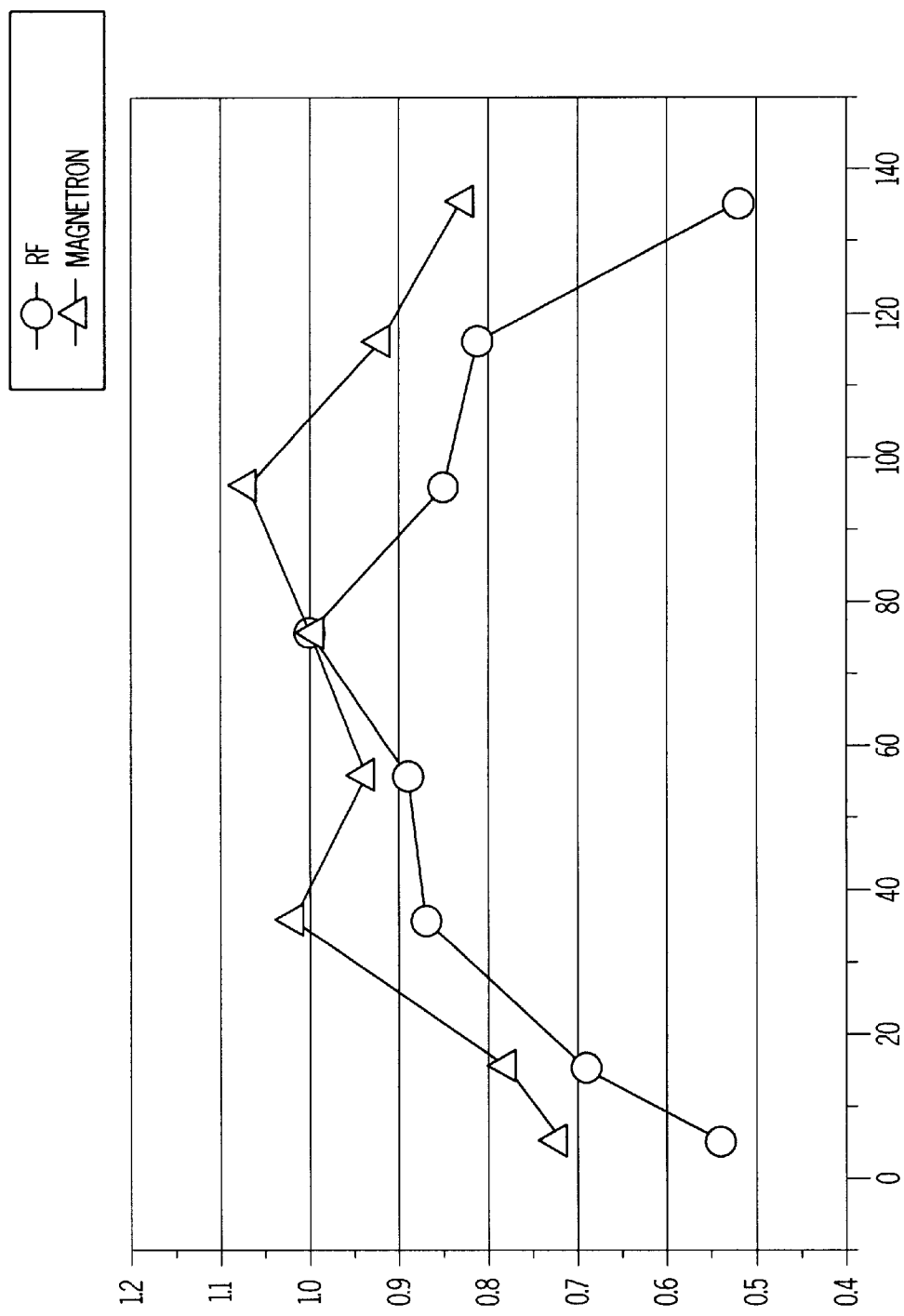
FIG. 9 is a graph showing a result of investigation of scraped amounts of the target in the conventional sputtering device.

FIG. 4 is a graph showing scraped amounts of the target. As a comparison example, a result for conventional magnetron sputtering device shown in FIG. 6 is shown in FIG. 4.

Following facts have been found from FIG. 4.
(1) By introducing the horizontal magnetic field on the surface of the target, the scraped amounts become more uniform than the conventional technique.
(2) The arrangement of magnets of FIG. 3 is further more uniform in the scraped amounts than the arrangement of magnets of FIG. 2.

Embodiment 2)

In the present embodiment, as the means for introducing magnetic field 101 in the sputtering device shown in FIG. 1, the magnet arrangement shown in FIG. 3 was used, and film qualities of deposit films were investigated for a case that the auxiliary electrodes A 104 and B 107 were not installed and for a case that the auxiliary electrodes A 104 and B 107 were installed.

When the auxiliary electrode B 107 was installed, frequency dependency was investigated with respect to radio frequency applied to the auxiliary electrode B 107 from the AC power supply 115. As the frequency, four kinds, 30 kHz, 13.56 MHz, 40 MHz, and 100 MHz, were used.

As the base body 105, a plurality of single crystal Si wafers (33 mmϕ) were placed on the electrode II 106. As the target 103, N-type Si (P-doped) was sputtered using Ar gas so as to deposit Si film on the base body 105. As the film quality of the deposit film, specific resistance was evaluated.

Figure 5:
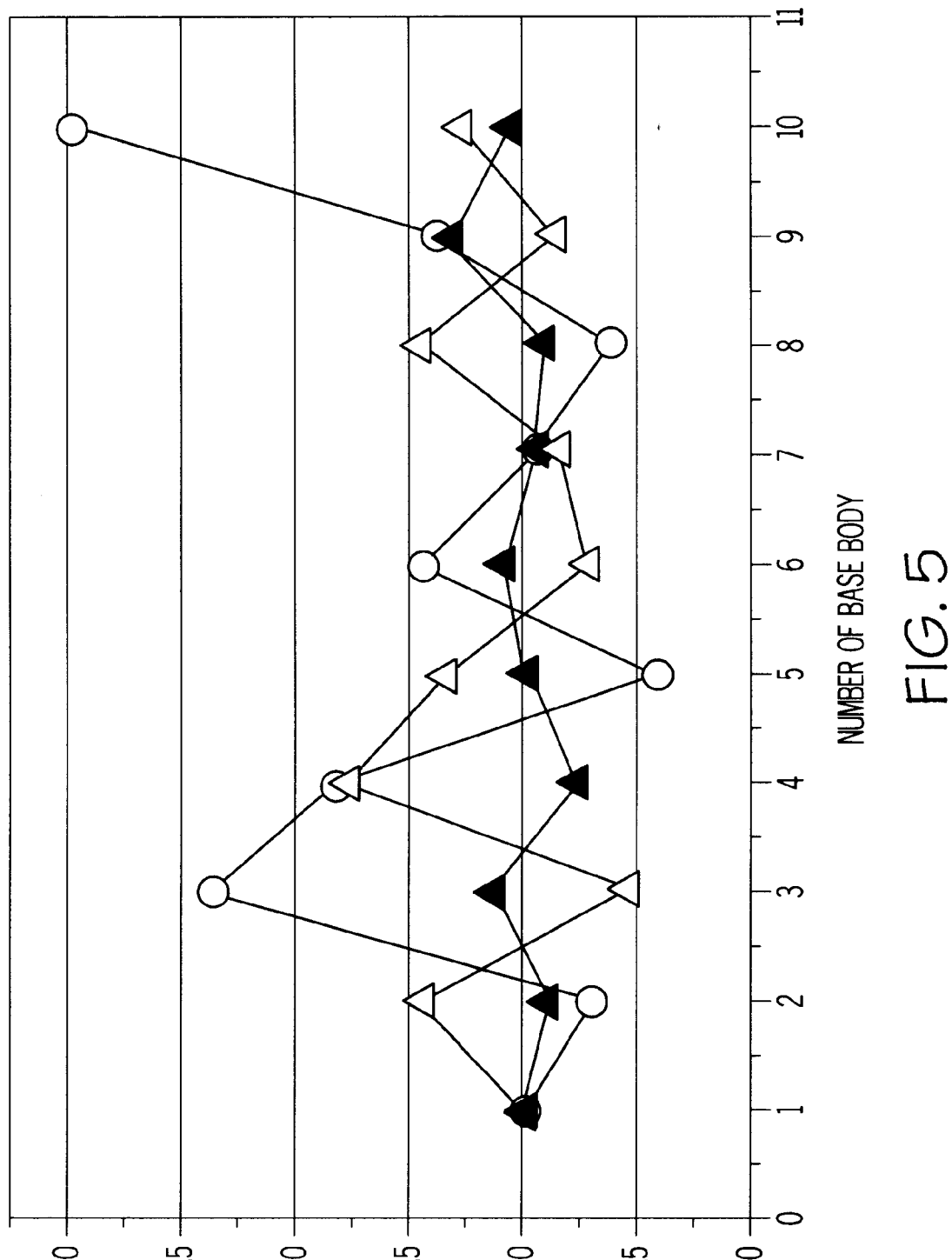
FIG. 5 is a graph showing specific resistance of the deposit film.

FIG. 5 is a graph showing results of measurements of specific resistances together. In FIG. 5, the symbol ○ shows the result in the case that the auxiliary electrode A 104 and the auxiliary electrode B 107 were not installed, the symbol Δ shows the result in the case that radio frequency of 40 MHz was applied to the auxiliary electrode B 107, and the symbol ▲ shows the result in the case that radio frequency of 100 MHz was applied to the auxiliary electrode B 107. Values of specific resistance shown in the ordinate axis of FIG. 5 are expressed being standardized by a value of specific resistance measured for a base body No. 1.

From FIG. 5, following facts have been found.

(1) In comparison with the case that the auxiliary electrodes A 104 and B 107 were not installed (shown by symbols ○), dispersion of the specific resistances was smaller in the cases that the auxiliary electrodes A 104 and B 107 were installed (shown by symbols Δ and ▲).

(2) The dispersion of the specific resistances was further smaller in the case that the frequency fc applied to the auxiliary electrode B 107 was sufficiently large relative to the frequency f (13.56 MHz) applied to the target through the electrode I 102 (namely, the case of fc=40 MHz had smaller dispersion of the specific resistances than the case of fc=100 MHz).

(3) The dispersion of the specific resistances was not improved when the frequency fc applied to the auxiliary electrode B 107 is smaller (380 kHz) than or equal (13.56 MHz) to the frequency f (13.56 MHz) applied to the target 103 through the electrode I 102, and the results were similar to the case that the auxiliary electrodes A 104 and B 107 were not installed (shown by symbols ○).

(4) In particular, in the case that the frequency fc (13.56 MHz) applied to the target 103 through the electrode I 102 was equal to the frequency fc (13.56 MHz) applied to the auxiliary electrode B 107, plasma interfered and electric discharge became unstable.

Thus, it is considered that the frequency fc of the radio frequency power applied to the auxiliary electrode B is larger than the frequency f of the radio frequency power applied to the above-described target through the above-described electrode I, film quality of the deposit film can be made uniform.

Effects of the Invention

As described above, according to the present invention, by introducing magnetic field horizontal to a target's surface to be sputtered, there is obtained the sputtering device in which scraped amounts of the target are uniform.

Further, film quality of the deposit film can be uniformed, by providing the auxiliary electrode A in contact with the electrode I and in the area outside the outer peripheral end of the target, and by providing the auxiliary electrode B in the area outside the outer peripheral end of the base body and in a location spaced from the base body and the above-described electrode II. In that case, it is more preferable if the frequency fc of the radio frequency power applied to the auxiliary electrode B is larger than the frequency f of the radio frequency power applied to the above-described target through the above-described electrode I.

What is claimed is:

1. A sputtering device provided with two electrodes I and II of parallel plate type within a vessel inside which pressure can be reduced, wherein:

a target to be sputtered is placed on said electrode I, and a base body on which a film is to be deposited is placed on said electrode II, with the target and the base body being opposed to each other;

a process gas is introduced into said vessel from a gas supply system;

a means for generating a magnetic field with a particular magnetic field oriented horizontal to a sputterable surface of the target;

a radio frequency power is applied to said target through at least said electrode I so as to excite plasma between the electrode I and the electrode II;

an auxiliary electrode B is supplied; and a frequency fc of a radio frequency power is applied to said auxiliary electrode B, said frequency being higher than a frequency f of the radio frequency power applied to said target through said electrode I.

2. The sputtering device according to claim 1, wherein: said auxiliary electrode B to which said radio frequency power is applied is provided in an area outside an outer peripheral end of said base body and in a position spaced from said base body and said electrode II.

* * * * *